(12) United States Patent
Hsu et al.

(10) Patent No.: US 6,846,691 B2
(45) Date of Patent: Jan. 25, 2005

(54) METHOD FOR MAKING MICROMECHANICAL STRUCTURES HAVING AT LEAST ONE LATERAL, SMALL GAP THEREBETWEEN AND MICROMECHANICAL DEVICE PRODUCED THEREBY

(75) Inventors: Wan-Thai Hsu, Ann Arbor, MI (US); John R. Clark, Novi, MI (US); Clark T. C. Nguyen, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/625,992

(22) Filed: Jul. 24, 2003

(65) Prior Publication Data

US 2004/0150057 A1 Aug. 5, 2004

Related U.S. Application Data

(63) Continuation of application No. 09/938,411, filed on Aug. 23, 2003.
(60) Provisional application No. 60/227,507, filed on Aug. 24, 2000.

(51) Int. Cl.[7] ............................................... H01L 21/00
(52) U.S. Cl. .......................................... 438/48; 438/50
(58) Field of Search ...................................... 438/48–53

(56) References Cited

U.S. PATENT DOCUMENTS

| 5,082,242 A | 1/1992 | Bonne et al. |
| 5,455,547 A | 10/1995 | Lin et al. |
| 5,491,604 A | 2/1996 | Nguyen et al. |
| 5,537,083 A | 7/1996 | Lin et al. |
| 5,589,082 A | 12/1996 | Lin et al. |

(List continued on next page.)

OTHER PUBLICATIONS

Hsu, Wan–Thai, et al., A Sub–Micron Capacitive Gap Process For Multiple–Metal–Electrode Lateral Micromechanical Resonators, Technical Digest, IEEE Int. Micro Electromechanical Systems Conf., Interlake, Switzerland, Jan. 21–25, 2001, pp. 349–352.

Hsu, Wan–Thai, et al., Mechanically Temperature–Compensated Flexural–Mode Micromechanical Resonators, Technical Digest, IEEE Int. Electron Devices Meeting, San Francisco, California, Dec. 11–13, 2000, pp. 399–402.

(List continued on next page.)

*Primary Examiner*—H. Jey Tsai
(74) *Attorney, Agent, or Firm*—Brooks Kushman, P.C.

(57) ABSTRACT

A method and resulting formed device are disclosed wherein the method combines polysilicon surface-micromachining with metal electroplating technology to achieve a capacitively-driven, lateral micromechanical resonator with submicron electrode-to-resonator capacitor gaps. Briefly, surface-micromachining is used to achieve the structural material for a resonator, while conformal metal-plating is used to implement capacitive transducer electrodes. This technology makes possible a variety of new resonator configurations, including disk resonators and lateral clamped-clamped and free-free flexural resonators, all with significant frequency and Q advantages over vertical resonators. In addition, this technology introduces metal electrodes, which greatly reduces the series resistance in electrode interconnects, thus, minimizing Q-loading effects while increasing the power handling ability of micromechanical resonators.

7 Claims, 2 Drawing Sheets

U.S. PATENT DOCUMENTS

| | | | |
|---|---|---|---|
| 5,620,931 A | * | 4/1997 | Tsang et al. .................. 438/50 |
| 5,640,133 A | | 6/1997 | MacDonald et al. |
| 5,839,062 A | | 11/1998 | Nguyen et al. |
| 5,914,553 A | | 6/1999 | Adams et al. |
| 5,955,932 A | | 9/1999 | Nguyen et al. |
| 6,167,757 B1 | | 1/2001 | Yazdi et al. |
| 6,204,737 B1 | | 3/2001 | Ella |
| 6,236,281 B1 | | 5/2001 | Nguyen et al. |
| 6,249,073 B1 | | 6/2001 | Nguyen et al. |
| 6,265,806 B1 | | 7/2001 | Suzuki |
| 6,305,779 B1 | | 10/2001 | Capurso et al. |
| 6,316,827 B1 | | 11/2001 | Asano et al. |
| 6,347,237 B1 | * | 2/2002 | Eden et al. ................. 505/210 |
| 6,393,913 B1 | | 5/2002 | Dyck et al. |
| 6,429,034 B1 | * | 8/2002 | Pai et al. ...................... 438/50 |
| 6,448,622 B1 | | 9/2002 | Franke et al. |

OTHER PUBLICATIONS

Clark, John R., et al., High–Q VHF Micromechanical Contour–Mode Disk Resonators, Technical Digest, IEEE Int. Electron Devices Meeting, San Francisco, California, Dec. 11–13, 2000, pp. 493–496.

Clark, John R., et al., Measurement Techniques For Capacitively–Transduced VHF–to–UHF Micromechanical Resonators, Digest of Technical Papers, the $11^{th}$ Int. Conf. on Solid–State Sensors & Actuators, Munich, Germany, Jun. 10–14, 2001, pp. 1118–1121.

C. T. –C. Nguyen, "Micromachining technologies for miniaturized communication devices," Proceedings of SPIE: Micromachining and Microfabrication, Sep. 20–22, 1998, pp. 24–38.

T. Hirano et al., "Design, Fabrication, and Operation of Submicron Gap Comb–Drive Microactuators," Journal of Microelectromechanical Systems, Mar. 1992, No. 1, pp. 52–59.

J. R. Tucker et al., "Nanoscale FETs and STM Lithography," University of Illinois, 1995, pp. 425–434.

C. T. –C. Nguyen, "High–Q Micromechanical Oscillators and Filters For Communications," Int'l Symposium on Circuits and Systems, Jun. 9–12, 1997, pp. 2825–2828.

K. Tanaka, "Nanotechnology towards the $21^{st}$ Century," Thin Solid Films, 1999, pp. 120–125.

* cited by examiner

METHOD FOR MAKING MICROMECHANICAL STRUCTURES HAVING AT LEAST ONE LATERAL, SMALL GAP THEREBETWEEN AND MICROMECHANICAL DEVICE PRODUCED THEREBY

CROSS-REFERENCE TO RELATED APPLICATIONS

This application is a continuation of U.S. Ser. No. 09/938,411 filed Aug. 23, 2003, entitled "Method For Making Micromechanical Structures Having At Least One Lateral, Small Gap Therebetween And Micromechanical Device Produced Thereby" which claims the benefit of U.S. provisional patent application Ser. No. 60/227,507 filed Aug. 24, 2000 and entitled "Process Technology For Lateral Small-Gap Micromechanical Structures".

STATEMENT REGARDING FEDERALLY SPONSORED RESEARCH OR DEVELOPMENT

This invention was made with Government support under DARPA Contract No. F30602-97-2-0101. The Government has certain rights in the invention.

BACKGROUND OF THE INVENTION

1. Field of the Invention

This invention relates to methods of making micromechanical structures having at least one lateral, small gap therebetween and micromechanical devices produced thereby.

2. Background Art

Vibrating mechanical tank components, such as crystal and SAW resonators, are widely used for frequency selection in communication sub-systems because of their high quality factor (Q's in tens of thousands) and exceptional stability against thermal variations and aging. In particular, the majority of heterodyning communication transceivers rely heavily on the high Q of SAW and bulk acoustic mechanical resonators to achieve adequate frequency selection in RF and IF filtering stages and to realize the required low phase noise and stability in their local oscillators. In addition, discrete inductors and variable capacitors are used to properly tune and couple the front end sense and power amplifiers, and to implement widely tunable voltage-controlled oscillators.

At present, the aforementioned resonators and discrete elements are off-chip components, and must interface with integrated electronics at board level, often consuming a sizable portion of the total sub-system area. In this respect, these devices pose an important bottleneck against the ultimate miniaturization and portability of wireless transceivers. For this reason, many research efforts have been focused on strategies for either miniaturizing these components or eliminating the need for them altogether.

The rapid growth of IC-compatible micromachining technologies that yield micro-scale, high-Q tank components may now bring the first of the above strategies closer to reality. Specifically, the high-Q RF and IF filters, oscillators, and couplers, currently implemented via off-chip resonators and discrete passives may now potentially be realized on the micro-scale using micromachined equivalents based on a variety of novel devices, including high-Q, on-chip, vibrating mechanical resonators, voltage-tunable, on-chip capacitors, isolated, low-loss inductors, microwave/mm-wave medium-Q filters, structures for high frequency isolation packaging, and low-loss mechanical switches. Once these miniaturized filters and oscillators become available, the fundamental bases on which communication systems are developed may also evolve, giving rise to new system architectures with possible power and bandwidth efficiency advantages.

Prototype high-Q oscillators featuring lateral comb-driven micromechanical resonators integrated together with sustaining electronics, all in a single chip, using a planar process that combines surface-micromachining and integrated circuits, have been demonstrated. The gap between the electrodes and the structure of the comb-driven micromechanical resonator is limited by lithography capability. Therefore, a submicron gap is very difficult to do. As the frequency of the resonator goes higher, the size of the resonator becomes smaller. So the electromechanical coupling is smaller. In order to increase the electromechanical coupling, a small-gap between the electrode and the structure is necessary. Although the capacitive gap of vertical micromechanical resonators, which is defined by the thickness of a sacrificial layer, can be very small, clamped-clamped beam vertical micromechanical resonators suffer from lower Q due to anchor dissipation. Also, it normally has only one port which limits its application range. Lateral resonators, on the other hand, have advantages of greater geometric design flexibility and more ports than normally attainable via vertical resonators. However, the electrode-to-resonator gap for capacitively-driven lateral resonators has historically been implemented via lithography and etching, and this greatly limits the degree by which the electrode-to-resonator gap spacing can be reduced.

In order to increase the electromechanical coupling for a lateral micromechanical resonator, a process to form a lateral submicron gap between an electrode and the resonator structure, without the need for advanced lithography tools, is desired.

SUMMARY OF THE INVENTION

An object of the present invention is to provide an improved method of making micromechanical structures having at least one lateral, small gap therebetween and a micromechanical device produced thereby.

In carrying out the above object and other objects of the present invention, a method is provided for making micromechanical structures having at least one lateral gap therebetween. The method includes providing a substrate, and surface micromachining the substrate to form a first micromechanical structure having a first vertical sidewall and a sacrificial spacer layer on the first vertical sidewall. The method also includes forming a second micromechanical structure on the substrate. The second micromechanical structure includes a second vertical sidewall separated from the first vertical sidewall by the spacer layer. The method further includes removing the spacer layer to form a first lateral gap between the first and second micromechanical structures.

The step of surface micromachining may further form a third vertical sidewall on the first micromechanical structure with the sacrificial spacer layer thereon and the method may further include forming a third micromechanical structure including a fourth vertical sidewall separated from the third vertical sidewall by the spacer layer. The step of removing may further form a second lateral gap between the first and third micromechanical structures.

The second micromechanical structure may include an electrode. The first micromechanical structure may include a resonator wherein the first lateral gap is an electrode-to-resonator capacitive gap.

The step of forming may include the step of plating metal on the substrate wherein the second micromechanical structure is a plated metal electrode.

The step of forming may include the step of selective epitaxial growth (SEG) to define the second micromechanical structure.

The method may further include preventing metal from being plated on the first micromechanical structure.

The first lateral gap is preferably a submicron gap.

Further in carrying out the above objects and other objects of the present invention, a micromechanical device is provided. The device includes a substrate, a first micromechanical structure supported on the substrate and having a first vertical sidewall, and a second micromechanical structure supported on the substrate and having a second vertical sidewall. The device further includes a first submicron lateral gap between the first and second vertical sidewalls to increase electromechanical coupling of the first and second micromechanical structures.

The second micromechanical structure may be a plated metal electrode or an SEG grown electrode and the first micromechanical structure may be a lateral resonator.

The first micromechanical structure may have a third vertical sidewall and the device may further include a third micromechanical structure supported on the substrate and having a fourth vertical sidewall and a second submicron lateral gap between the third and fourth vertical sidewalls to increase electromechanical coupling of the first and third micromechanical structures.

The lateral resonator may be a polysilicon resonator such as a flexural-mode resonator beam.

The substrate may be a semiconductor substrate such as a silicon substrate.

The first submicron lateral gap may be a capacitive gap.

The second and third micromechanical structures may be electrodes such as plated metal electrodes.

The first and second submicron lateral gaps may be capacitive gaps.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1A:
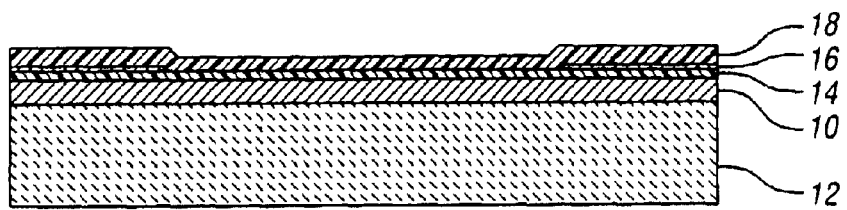
FIG. 1a is a side sectional schematic view of an insulation layer comprising oxide and nitride layers formed on a substrate, a patterned polysilicon layer and a sacrificial oxide layer deposited thereon.

A preferred embodiment for a small-gap, lateral resonator process flow of the present invention is presented in FIGS. 1a–1h. As shown in FIG. 1a, this process starts with a 2 $\mu$m thick oxide film 10 (i.e. $SiO_2$) thermally grown on a silicon substrate 12 and a 3000 Å thick film 14 of nitride (i.e. $Si_3N_4$) which together serve as an isolation layer. After a 3000 Å thick low stress polysilicon layer 16 is deposited via LPCVD, doped and patterned via reactive ion etching (RIE), a 5000 Å thick layer 18 of sacrificial oxide (i.e. $SiO_2$) is deposited by LPCVD.

Figure 1B:
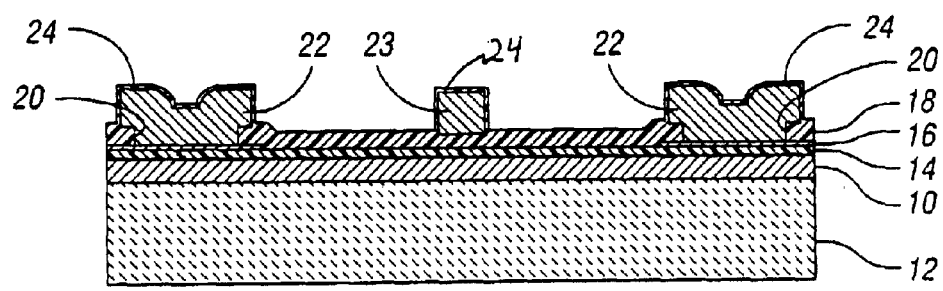
FIG. 1b is a side sectional schematic view of the layers of FIG. 1a after opening for anchors are formed and a patterned polysilicon layer and a gap sacrificial oxide deposited thereon.

As shown in FIG. 1b, vias 20 are patterned into the sacrificial oxide layer 18 by RIE, exposing the underlying polysilicon layer 16 in specific areas to later serve as anchors for eventual structures. A 2 $\mu$m thick structural layer of low stress polysilicon is then deposited via LPCVD and patterned also via RIE to form anchor structures 22 and a resonator structure 23 with straight side walls. A 1000 Å thick layer 24 of conformal LPCVD oxide is then deposited in order to define the small-gap spacing of the present invention. This oxide could also be thermally grown over the polysilicon or silicon structures.

Figure 1C:
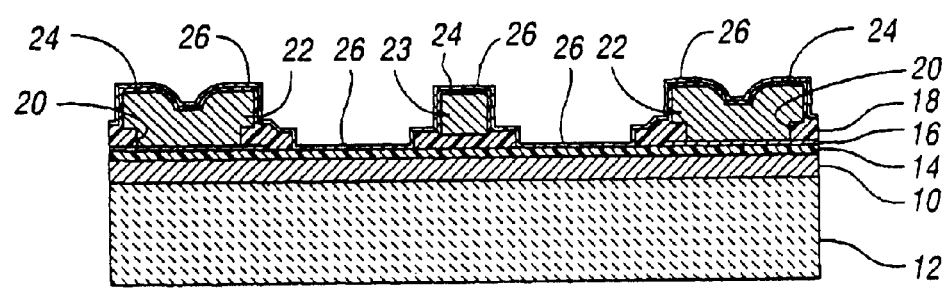
FIG. 1c is a side sectional schematic view of the sacrificial oxide after etching and an evaporated seed layer together with the structures of FIG. 1b.

As shown in FIG. 1c, the sacrificial oxide layer 18 is then etched (RIE and wet etch) until the isolation nitride layer 14 is exposed in regions where metal electrodes are to be formed. A thin metal layer (Cr200 Å/Au300 Å/Cr200 Å) is then evaporated over all areas of the wafer to serve as a seed layer 26 for electrode plating. The top Cr layer of the seed layer 26 is used to enhance the adhesion between the seed layer 26 and a plating mold while the bottom Cr layer of the seed layer 26 is for the adhesion between the middle Au layer and the underneath nitride layer 14.

Figure 1D:
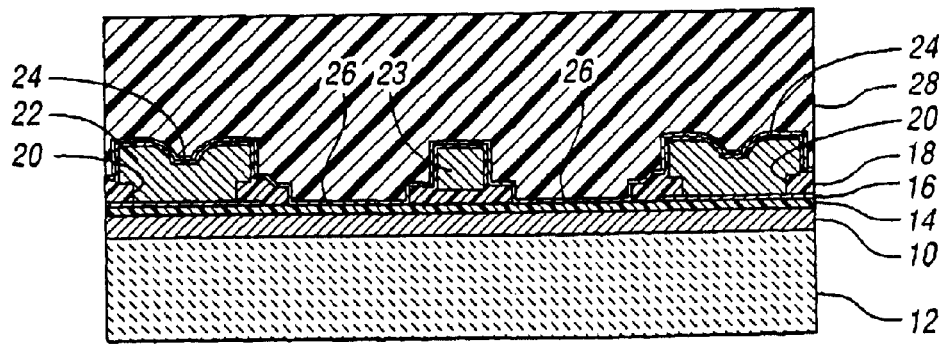
FIG. 1d is a side sectional schematic view of a thick photoresist for planarization etch back which has been spun on the structures of FIG. 1c.
Figure 1E:
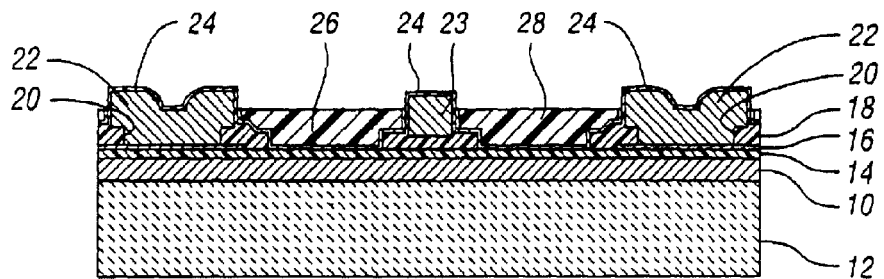
FIG. 1e is a side sectional schematic view with the PR etched back to the top of the structures and the seed layer etched on the top of the structures.

As shown in FIG. 1d, in order not to plate metal on top of the structures 22 and 23 while forming the electrode, a thick layer 28 of photoresist (PR) is first spun on. Then, the layer 28 is planarized and etched back via RIE to expose the seed metal layer 26 on top of the structures 22 and 23 as shown in FIG. 1e. The seed layer 26 on top of the structures 22 and 23 is then removed by wet etching to prevent metal from plating over the tops of the polysilicon structures 22 and 23 during subsequent electroplating steps.

Figure 1F:
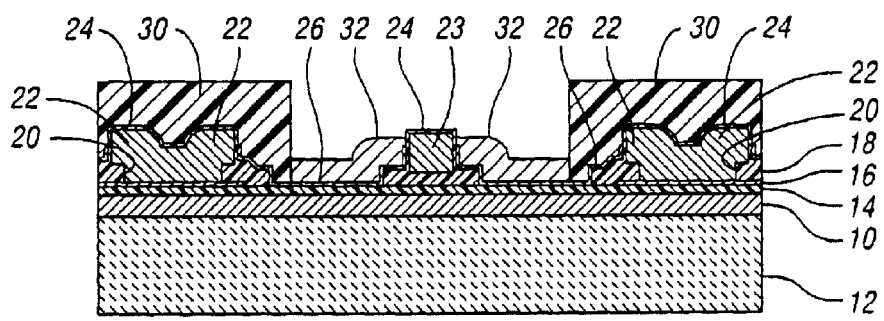
FIG. 1f is a side sectional schematic view of the structures of FIG. 1e after the PR is stripped, a PR plating mold is formed and Au electrodes are plated.

As shown in FIG. 1f, after the rest of the PR is removed, a plating PR mold 30 is formed by lithography, the Cr layer on top of the exposed seed layer 26 is removed and then Au electrodes 32 are plated on the exposed Au layer of the seed layer 26 between vertical side walls of the resonator structure 23 and the photoresist mold 30 which together define the electrode plating boundaries.

Figure 1G:
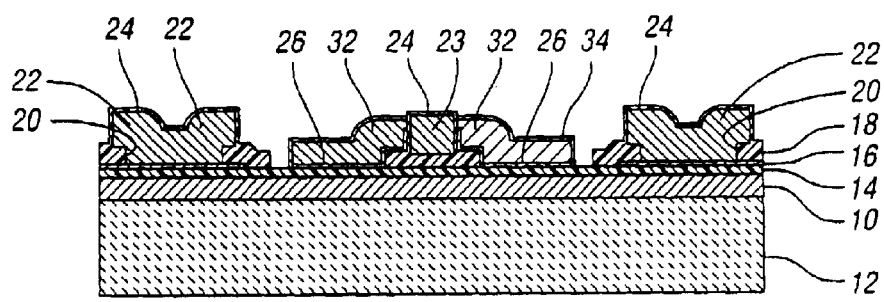
FIG. 1g is a side sectional schematic view of the structures of FIG. 1f with the PR mold stripped, the seed layers removed and an Ni layer formed on the electrodes.

As shown in FIG. 1g, a thin layer 34 of Ni is plated on the electrodes 32 in order to protect the surface of the Au electrode regions while portions of the seed layer 26 are being removed.

FIG. 1g shows the PR mold 30 and the portions of the seed layer 26 removed.

Figure 1H:
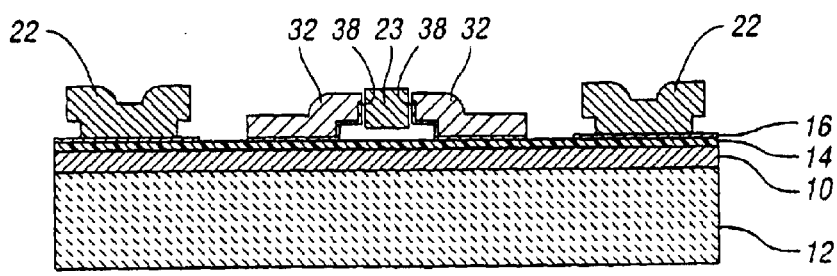
FIG. 1h is a side sectional schematic view of the structures of FIG. 1g after HF release and the Ni layer removed.

As shown in FIG. 1h, the layer 34 of Ni is removed and finally, the resonator structure 23, separated by sub-micron gaps 38 between the two metal electrodes 32, is free to move after HF release to remove the layer 24 and the layer 18.

Benefits accruing to the invention are numerous. For example, the main advantages and contributions of this invention are:

(i) metal electrodes: less interconnect resistance, more power handling;

(ii) submicron, sacrificial-film-determined lateral gaps between the resonator and the electrodes;

(iii) higher Q in some resonators, given the anchoring options;

(iv) increase electromechanical couplings, thus increase the efficiency of resonators, gyroscopes, accelerometers, etc.;

(v) allow more flexible mechanical circuit configurations;

(vi) make high frequency disk resonators possible;

(vii) makes stress-compensated resonators possible; and (viii) makes two-port resonator oscillator configurations easier to manufacture.

The method of the invention can be used to form:

(1) micromechanical structures (including resonators, gyroscopes, and accelerometers, etc.) driven and sensed by metal electrodes plated along the side walls of the structure; and (2) small capacitive gaps between the micromechanical structure and plated metal electrodes defined by the thickness of sacrificial layer (not only oxide, this sacrificial layer can be any kind of material).

The etch back process used to prevent metal plated on top of the resonator structure 23 (FIGS. 1d–1e) is also particularly useful. Also particularly useful is the seed layer combination Cr/Au/Cr or Cr/Ni that survives in straight HF release. Optional plated metals (Au, Ni, Pd, Pt, Cu) also can serve as electrode materials. Alternatively, the process can be modified wherein epi-Si is grown to serve as the electrodes.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for making micromechanical structures having at least one lateral gap therebetween, the method comprising:

providing a substrate;

surface micromachining the substrate to form a capacitively-driven, lateral micromechanical structure having a first vertical sidewall and a sacrificial spacer layer on the first vertical sidewall;

forming a first capacitive transducer electrode on the substrate, the first capacitive transducer electrode including a second vertical sidewall separated from the first vertical sidewall by the spacer layer; and removing the spacer layer to form a first lateral submicron capacitive gap between the micromechanical structure and the first capacitive transducer electrode to increase electromechanical coupling therebetween.

2. The method as claimed in claim 1 wherein the step of surface micromachining further forms a third vertical sidewall on the micromechanical structure with the sacrificial spacer layer thereon and wherein the method further comprises forming a second capacitive transducer electrode including a fourth vertical sidewall separated from the third vertical sidewall by the spacer layer and wherein the step of removing further forms a second lateral submicron gap between the micromechanical structure and the second capacitive transducer electrode.

3. The method as claimed in claim 1 wherein the micromechanical structure includes a resonator and wherein the first lateral submicron capacitive gap is an electrode-to-resonator capacitive gap.

4. The method as claimed in claim 1 wherein the step of forming includes the step of plating metal on the substrate and wherein the first capacitive transducer electrode is a plated metal electrode.

5. The method as claimed in claim 4 further comprising preventing metal from being plated on the micromechanical structure.

6. The method as claimed in claim 1 wherein the step of forming includes the step of growing the first capacitive transducer electrode via selective epitaxial growth.

7. The method as claimed in claim 1 wherein the step of forming includes the steps of depositing polysilicon and etching the polysilicon to form the first capacitive transducer electrode.

* * * * *

UNITED STATES PATENT AND TRADEMARK OFFICE
CERTIFICATE OF CORRECTION

PATENT NO. : 6,846,691 B2
DATED : January 25, 2005
INVENTOR(S) : Wan-Thai Hsu, John R. Clark and Clark T.-C. Nguyen It is certified that error appears in the above-identified patent and that said Letters Patent is hereby corrected as shown below:

Title page,
Item [63], Related U.S. Application Data, "Aug. 23, 2003" should read -- Aug. 23, 2001 --.

Column 1,
Line 11, "Aug. 23, 2003" should read -- Aug. 23, 2001 --.

Signed and Sealed this

Twenty-fourth Day of May, 2005

JON W. DUDAS
*Director of the United States Patent and Trademark Office*